US006744306B2

(12) United States Patent
Yonezawa

(10) Patent No.: US 6,744,306 B2
(45) Date of Patent: Jun. 1, 2004

(54) FILTER CIRCUIT

(75) Inventor: Katsuyuki Yonezawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/032,058

(22) Filed: Dec. 31, 2001

(65) Prior Publication Data

US 2002/0121926 A1 Sep. 5, 2002

(30) Foreign Application Priority Data

Jan. 10, 2001 (JP) ...................................... P2001-002272

(51) Int. Cl.$^7$ ................................................ H04B 1/10
(52) U.S. Cl. ........................ 327/552; 327/558; 327/559; 330/303
(58) Field of Search ................................ 327/552, 558, 327/559, 577; 330/252, 303

(56) References Cited

U.S. PATENT DOCUMENTS

| 4,965,528 A | * | 10/1990 | Okanobu ............... 330/252 |
| 5,742,199 A | * | 4/1998 | Shoji et al. ............ 327/552 |
| 5,847,605 A | * | 12/1998 | Mihailovits et al. ...... 330/252 |
| RE36,861 E | * | 9/2000 | Koyama et al. .......... 330/261 |

FOREIGN PATENT DOCUMENTS

JP 9-69752 3/1997 ........... H03H/11/04

* cited by examiner

*Primary Examiner*—Timothy P. Callahan
*Assistant Examiner*—Terry L. Englund
(74) *Attorney, Agent, or Firm*—Rader, Fishman & Grauer PLLC; Ronald P. Kananen

(57) ABSTRACT

A filter circuit includes two first differential circuits disposed on A and B sides, in each of which a ratio of the number of transistors to that of diodes is 1:4, and two second differential circuits disposed on the A and B sides, in each of which the ratio of the number of transistors to that of diodes is 4:1. Base electrodes of the transistors of the A-side first differential circuit and the A-side second differential circuit are connected to a circuit input terminal, while base electrodes of the transistors of the B-side first differential circuit and the B-side second differential circuit are connected to another circuit input terminal. A current source is connected to an A-side connection node for the A-side first differential circuit and the A-side second differential circuit and another current source is connected to a B-side connection node for the B-side first differential circuit and the B-side second differential circuit. A capacitor is connected between a connection point of the A-side connection node and a circuit output terminal and a connection point of the B-side connection node and another circuit output terminal.

5 Claims, 13 Drawing Sheets

FILTER CIRCUIT

BACKGROUND OF THE INVENTION

The present invention relates to a filter circuit such as a first-order low-pass filter, a first-order high-pass filter, or a first-order all-pass filter, and particularly to a filter circuit with a wide dynamic range capable of low-voltage operation.

As a conventional example of a filter circuit, for example a first-order low-pass filter with a wide dynamic range capable of low-voltage operation, a filter circuit disclosed in Japanese Patent Laid-Open No. Hei 9-69752 is known, for example. A circuit configuration of the first-order low-pass filter according to the conventional example is shown in FIG. 13.

In FIG. 13, a base electrode of a transistor Q1 is connected to a circuit input terminal 101 of one of differential inputs. A collector electrode of the transistor Q1 is connected to a power supply line 103 of a supply voltage VCC. An emitter electrode of the transistor Q1 is connected with an emitter electrode of a transistor Q2. The transistor Q2 is of a diode-connected configuration, in which a base electrode and a collector electrode of the transistor Q2 are connected to each other. A current source 111 is connected between a GND line 104 at a ground level and a common emitter connection point of the transistors Q1 and Q2.

The base electrode and the collector electrode of the transistor Q2 are connected with a base electrode and a collector electrode of a transistor Q3. Thus, the transistor Q3 is also of the diode-connected configuration, and is connected in parallel with the diode-connected transistor Q2 with a polarity opposite from the transistor Q2. A current source 112 is connected between the power supply line 103 and a common connection point of the bases and the collectors of the transistors Q2 and Q3. An emitter electrode of the transistor Q3 is connected with an emitter electrode of a transistor Q4. A current source 113 is connected between the GND line 104 and a common emitter connection point of the transistors Q3 and Q4.

By thereafter repeating the same connecting relation, a total of n transistors Q1 to Qn are connected to one another. Then, a current source 114 is connected between the GND line 104 and a common emitter connection point of an (n−1)th diode-connected transistor Qn−1 and an nth diode-connected transistor Qn in a final stage. A current source 115 is connected between the power supply line 103 and a common connection point of a base and a collector of the transistor Qn. The common connection point of the base and the collector of the transistor Qn is also connected to a circuit output terminal 105 of one of differential outputs, and connected to one terminal of a capacitor 107.

A circuit formed by n transistors (transistors Q2n to Qn+1) and current sources in exactly the same connecting relation as the above circuit is connected between a circuit input terminal 102 of the other differential input, a circuit output terminal 106 of the other differential output, and the other terminal of the capacitor 107. It is to be noted that the first-order low-pass filter according to the present example is an example of a circuit when n is an even number; when n is an odd number, the connecting relation of the nth transistor Qn (Qn+1), the circuit output terminal 105 (106), and the one terminal (other terminal) of the capacitor 107 is as shown in FIG. 14.

A circuit equivalent to the thus formed first-order low-pass filter according to the conventional example is shown in FIG. 15. As is clear from the equivalent circuit, the first-order low-pass filter has a circuit configuration in which n emitter resistances re of the transistors are connected in series with each other between the circuit input terminal 101 and the circuit output terminal 105 and between the circuit input terminal 102 and the circuit output terminal 106, and the capacitor 107 is connected between the circuit output terminals 105 and 106.

Letting vi be an input signal, vo be an output signal, I be a current flowing in each of the transistors, C be capacitance of the capacitor 107, and s be a complex frequency, a transfer function H (=vo/vi) of the first-order low-pass filter is:

[Equation 1]

$$H = \frac{\frac{1}{2re \cdot n \cdot C}}{s + \frac{1}{2re \cdot n \cdot C}} \quad (1)$$

The emitter resistance re is expressed as re=Vt/I, where Vt=kT/q, k being the Boltzmann constant, T being the absolute temperature, and q being the amount of electron charge. The cut-off frequency fc is:

$$fc = \frac{1}{4\pi \cdot re \cdot n \cdot C}$$

As is clear from FIG. 13 and FIG. 14, because of the circuit configuration in which only two current sources and one transistor circuit are arranged between the power supply line 103 and the GND line 104, the first-order low-pass filter according to the conventional example has advantages of being able to operate at a low supply voltage and extend the input dynamic range by a factor of n by increasing the number n of transistors.

However, in the first-order low-pass filter formed as described above according to the conventional example, the extension of the input dynamic range requires an increase of the number n of transistors, and hence when the cut-off frequency fc and the capacitance C of the capacitor 107 are fixed, the increase of the number n of transistors results in an exponential increase in current consumption in accordance with the number n.

SUMMARY OF THE INVENTION

The present invention has been made in view of the above problem, and it is accordingly an object of the present invention to provide a filter circuit of low-voltage operation that can extend the input dynamic range while reducing current consumption.

In order to achieve the above object, according to the present invention, there is provided a filter circuit comprising: a first differential circuit formed by a combination of one transistor and four diodes connected in parallel with each other and each having one electrode connected to a first electrode of the transistor, a first current corresponding to an input signal flowing through the four diodes; and a second differential circuit formed by a combination of one diode and four transistors connected in parallel with each other and each having a first electrode connected to one electrode of the diode, a second current corresponding to the input signal flowing through the one diode. Further, a current source is connected to a common connection node of the four diodes and the one diode. A capacitor through which a current determined by a current of the current source and the first and second currents flows is connected to predetermined nodes, whereby a low-pass filter, a high-pass filter, or an all-pass filter is formed.

Hereinafter, bipolar transistors will be taken as an example of the transistors forming the first and second differential circuits. In this case, the first electrode of the transistor refers to an emitter electrode for injecting a carrier (electron or hole); a second electrode refers to a collector electrode reached by the carrier; and a control electrode refers to a base electrode supplied with a current for controlling movement of the carrier injected from the emitter electrode. The one electrode of a diode refers to a cathode electrode, and when the diode is formed by a transistor, the electrode refers to an emitter electrode.

By providing the thus formed filter circuit with the first differential circuit in which a ratio of the number of transistors to that of diodes is 1:4 and the second differential circuit in which the ratio of the number of transistors to that of diodes is 4:1, and by connecting the current source to the connection node of the diodes, the differential circuits have two operating points. By adding together the first and second differential circuits having two operating points, it is possible to extend the dynamic range. In addition, the cut-off frequency is made variable by changing the current of the current source.

DETAILED DESCRIPTION OF PREFERRED EMBODIMENTS

Preferred embodiments of the present invention will hereinafter be described in detail with reference to the drawings.

[First Embodiment]

Figure 1:
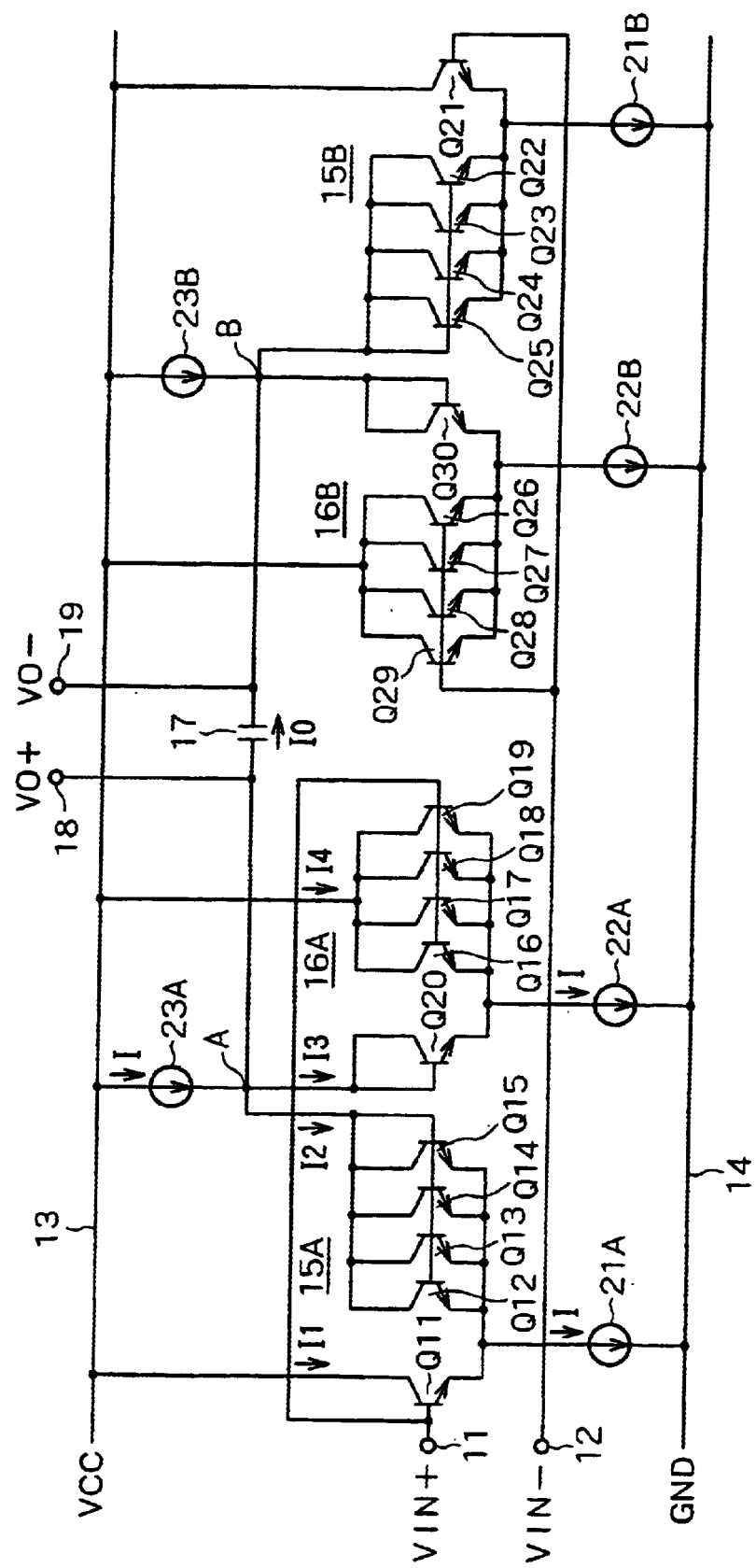
FIG. 1 is a circuit diagram of a configuration of a filter circuit according to a first embodiment of the present invention, showing a case in which the present invention is applied to a first-order low-pass filter.

FIG. 1 is a circuit diagram showing a configuration of a filter circuit according to a first embodiment of the present invention. FIG. 1 shows a case in which the present invention is applied to a first-order low-pass filter. Description in the following will be made by taking as an example a case where NPN-type bipolar transistors are used as transistors forming the circuit.

In FIG. 1, a base electrode of a transistor Q11 is connected to a circuit input terminal 11, which is supplied with an input signal VIN+ of one of differential inputs. A collector electrode of the transistor Q11 is connected to a first power supply, for example a power supply line 13 of a supply voltage VCC. An emitter electrode of the transistor Q11 is connected with an emitter electrode of a transistor Q12. The transistor Q12 is of a diode-connected configuration, in which a base electrode and a collector electrode of the transistor Q12 are connected to each other. The diode-connected transistor Q12 is connected in parallel to three diode-connected transistors Q13 to Q15 similar to the diode-connected transistor Q12.

Thus, the four diode-connected transistors Q12 to Q15 in total are connected in parallel to each other. The transistors Q12 to Q15 and the transistor Q11 form a first differential circuit 15A. A current source 21A is connected between a common emitter connection point of the transistors Q11 to Q15 and a second power supply, for example a GND line 14 at a ground level. The circuit input terminal 11 is also connected to each of base electrodes of four transistors Q16 to Q19. The transistors Q16 to Q19 are connected in parallel to each other, that is, emitters of the transistors Q16 to Q19 are connected to each other and collectors of the transistors Q16 to Q19 are connected to each other. The collector electrodes of the transistors Q16 to Q19 are connected to the power supply line 13.

The emitter electrodes of the transistors Q16 to Q19 are connected with an emitter electrode of a transistor Q20. The transistor Q20 is of the diode-connected configuration. The transistor Q20 and the transistors Q16 to Q19 form a second differential circuit 16A. A current source 22A is connected between a common emitter connection point of the transistors Q16 to Q20 and the GND line 14.

A common connection point of the bases and collectors of the transistors Q12 to Q15 in the first differential circuit 15A is connected to a common connection point of a base and a collector of the transistor Q20 in the second differential circuit 16A. A current source 23A is connected between the connection node A and the power supply line 13. Also, the connection node A is connected to one terminal of a capacitor 17, and connected to a circuit output terminal 18. An output signal VO+ is derived from the circuit output terminal 18.

A circuit having a configuration identical with the configuration of the above circuit is further provided symmetrically with respect to the capacitor 17 between a circuit input terminal 12 supplied with an input signal of the other differential input, that is, an input signal VIN− that is opposite in polarity from the input signal VIN+, a circuit output terminal 19 on the negative side, and the other terminal of the capacitor 17.

Specifically, a base electrode of a transistor Q21 is connected to the circuit input terminal 12. A collector electrode of the transistor Q21 is connected to the power supply line 13. An emitter electrode of the transistor Q21 is connected with an emitter electrode of a transistor Q22. The transistor Q22 is of the diode-connected configuration. The diode-connected transistor Q22 is connected in parallel to three diode-connected transistors Q23 to Q25 similar to the diode-connected transistor Q22.

Thus, the four diode-connected transistors Q22 to Q25 in total are connected in parallel to each other. The transistors Q22 to Q25 and the transistor Q21 form a first differential circuit 15B. A current source 21B is connected between a common emitter connection point of the transistors Q21 to Q25 and the GND line 14. The circuit input terminal 12 is also connected to each of base electrodes of four transistors Q26 to Q29. The transistors Q26 to Q29 are connected in parallel to each other. Collector electrodes of the transistors Q26 to Q29 are connected to the power supply line 13.

Emitter electrodes of the transistors Q26 to Q29 are connected with an emitter electrode of a transistor Q30. The transistor Q30 is of the diode-connected configuration. The transistor Q30 and the transistors Q26 to Q29 form a second differential circuit 16B. A current source 22B is connected between a common emitter connection point of the transistors Q26 to Q30 and the GND line 14.

A common connection point of the bases and collectors of the transistors Q22 to Q25 in the first differential circuit 15B is connected to a common connection point of a base and a collector of the transistor Q30 in the second differential circuit 16B. A current source 23B is connected between the connection node B and the power supply line 13. Also, the connection node B is connected to the other terminal of the capacitor 17, and connected to the circuit output terminal 19. An output signal VO− is derived from the circuit output terminal 19.

An input dynamic range in the thus formed filter circuit according to the first embodiment, that is, the first-order low-pass filter is affected by impedance of the capacitor 17. Specifically, when the impedance of the capacitor 17 is high, that is, frequency of the input signal vi is low, the dynamic range is increased, whereas when the frequency of the input signal vi is high, the dynamic range is decreased. As the frequency of the input signal vi becomes higher, the capacitor 17 approaches a short-circuited state.

When it is assumed that the capacitor 17 is in a short-circuited state when the input signal vi is applied between the circuit input terminals 11 and 12, and consideration is given to a current IO flowing through the capacitor 17 in that state, a voltage applied between both terminals of the capacitor 17 is a middle point between the input voltage VIN+ and the input voltage VIN−.

When considering the circuit on the left side of FIG. 1 and supposing that currents flowing through the transistor Q11 and the transistors Q12 to Q15 in the first differential circuit 15A are I1 and I2, respectively, the following equation is obtained:

$$vi/2 = Vt \ln(I1/Is) - Vt \ln(I2/4Is) \quad (1)$$

where the current Is is a saturation current and is a constant determined by transistor fabrication process.

Letting I be a current of the current source 21A, $$I1 + I2 = I \quad (2)$$

Thus, from the equation (1) and the equation (2), [Equation 2]

$$I1 = \frac{Ie^{\frac{vi}{2Vt}}}{4 + e^{\frac{vi}{2Vt}}} \quad (3)$$

$$I2 = \frac{4I}{4 + e^{\frac{vi}{2Vt}}} \quad (4)$$

On the other hand, letting I3 and I4 be currents flowing through the transistor Q20 and the transistors Q16 to Q19, respectively, in the second differential circuit 16A, $$vi/2 = Vt \ln(I3/4Is) - Vt \ln(I4/Is) \quad (5)$$

Letting I be a current of the current source 22A, $$I3 + I4 = I \quad (6)$$

Thus, from the equation (5) and the equation (6), [Equation 3]

$$I3 = \frac{I}{1 + 4e^{\frac{vi}{2Vt}}} \quad (7)$$

$$I4 = \frac{4Ie^{\frac{vi}{2Vt}}}{1 + 4e^{\frac{vi}{2Vt}}} \quad (8)$$

Hence, from the equation (4) and the equation (7), the current IO flowing through the capacitor 17 is: [Equation 4]

$$IO = I - I2 - I3 = \frac{4I\left(e^{\frac{vi}{Vt}} - 1\right)}{\left(4 + e^{\frac{vi}{2Vt}}\right)\left(1 + 4e^{\frac{vi}{2Vt}}\right)} \quad (9)$$

When letting vi=0, $$I1 = I3 = I/5, \quad I2 = I4 = (4/5)I$$

Exactly the same as described for the first differential circuit 15A and the second differential circuit 16A applies to the first differential circuit 15B and the second differential circuit 16B on the right side of FIG. 1.

Figure 2:
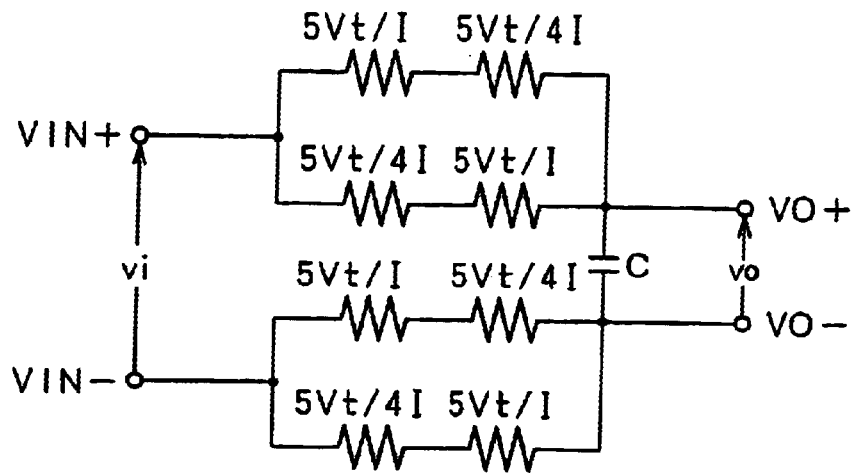
FIG. 2 is a diagram of a circuit equivalent to the filter circuit according to the first embodiment.

A circuit equivalent to the filter circuit of FIG. 1 is shown in FIG. 2. Thus, letting C be capacitance of the capacitor 17, the filter circuit according to the first embodiment serves as a first-order low-pass filter having a transfer function H (=vo/vi):
[Equation 5]

$$H = \frac{\frac{4I}{25Vt \cdot C}}{s + \frac{4I}{25Vt \cdot C}} \quad (10)$$

Cut-off frequency fc of the filter is:

$$fc = 2I/25 \, \pi \cdot Vt \cdot C$$

Figure 13:
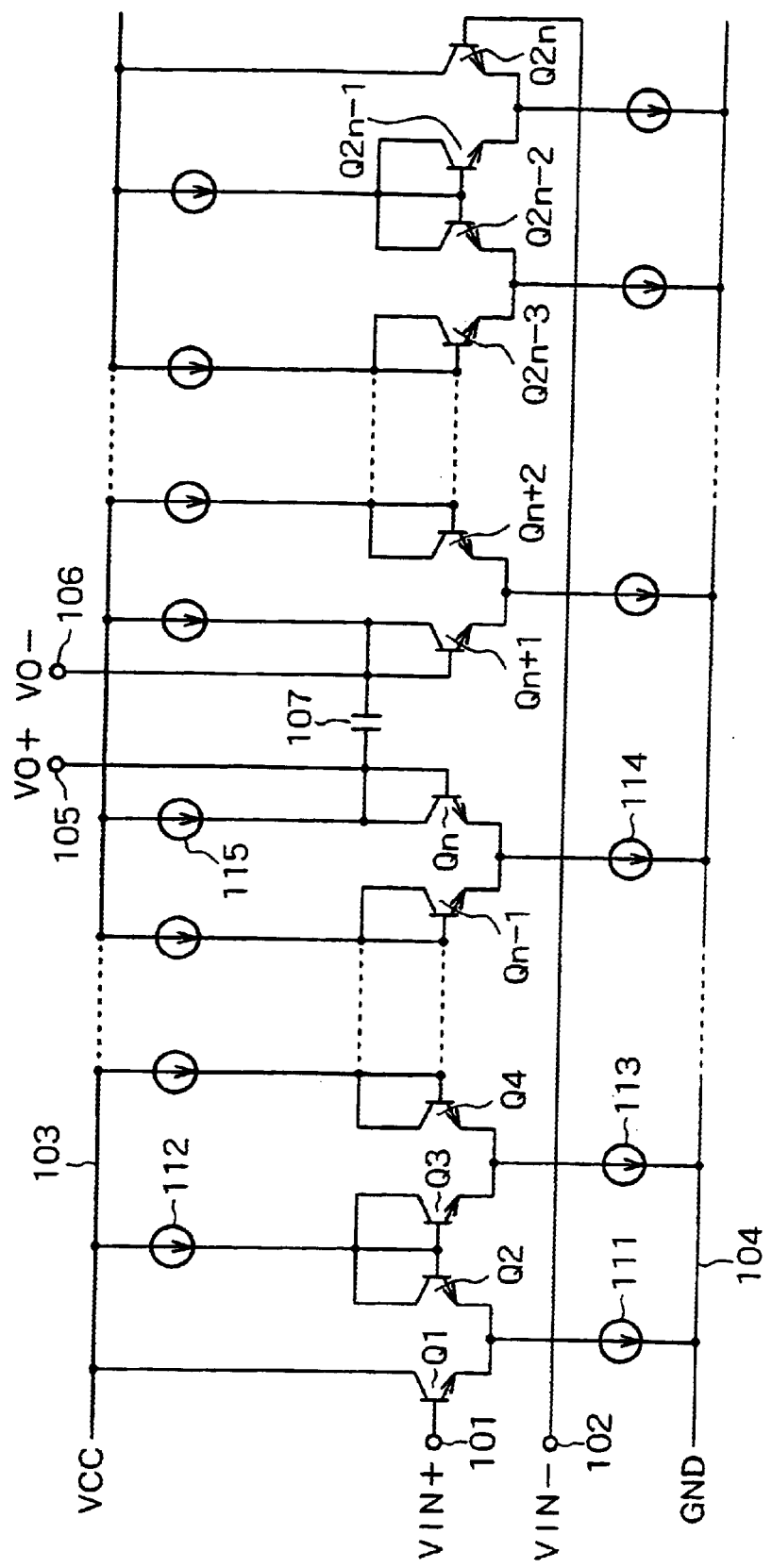
FIG. 13 is a circuit diagram showing a first-order low-pass filter according to a conventional example in which n is an even number.
Figure 14:
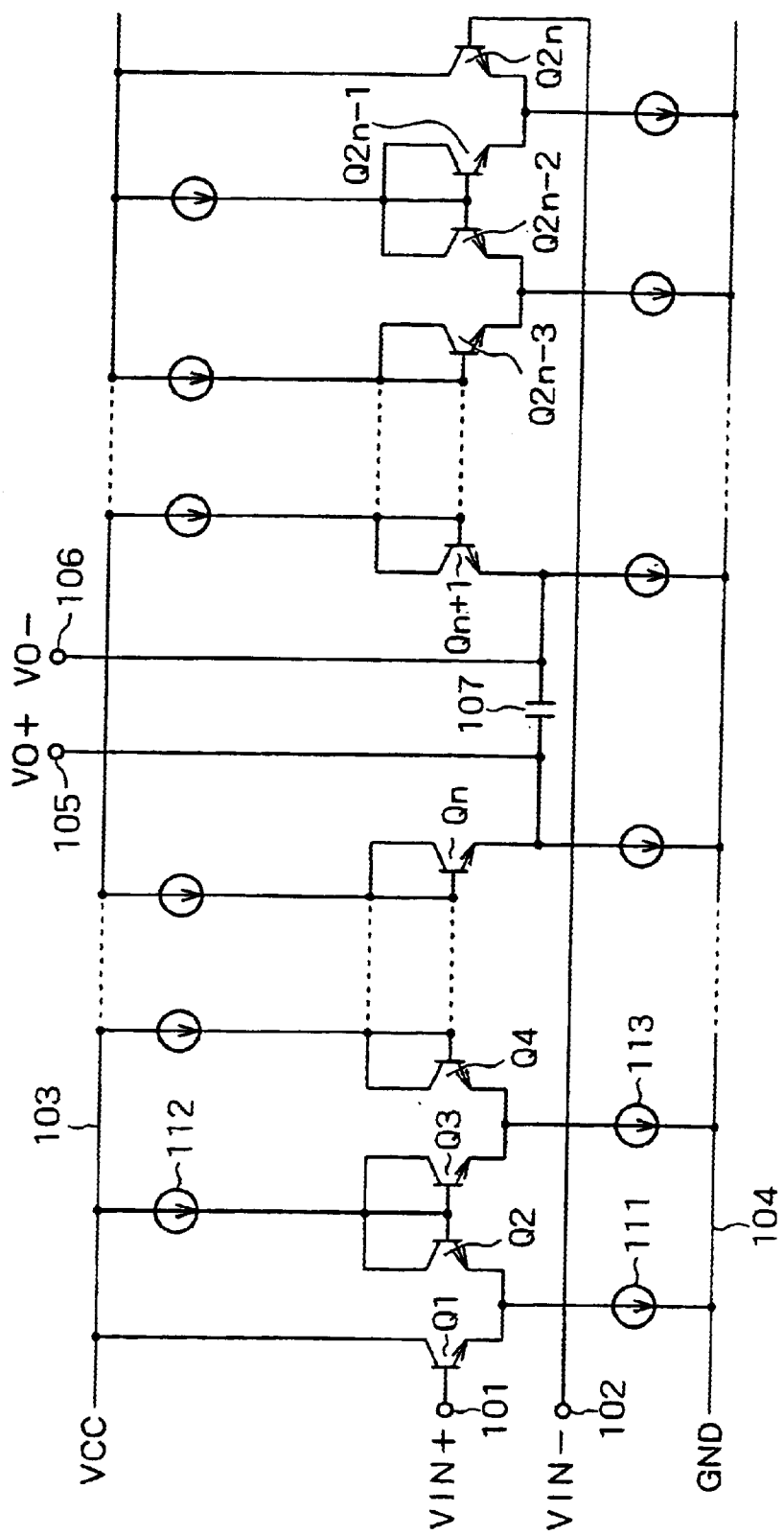
FIG. 14 is a circuit diagram showing a first-order low-pass filter according to a conventional example in which n is an odd number.
Figure 15:
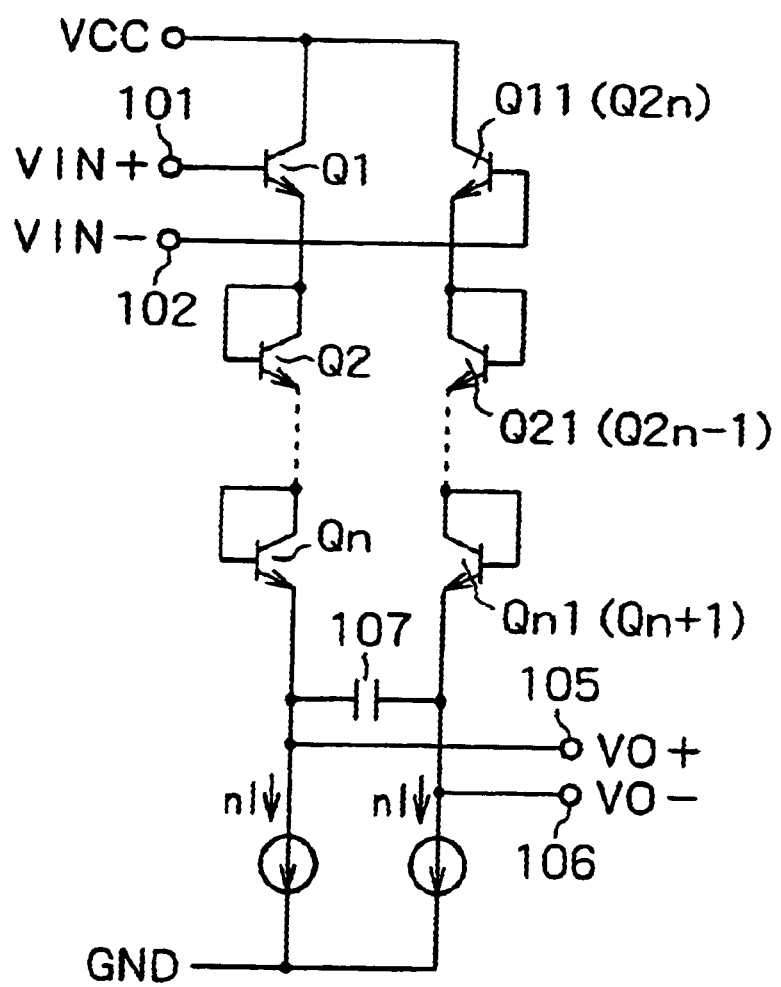
FIG. 15 is a diagram of a circuit equivalent to the first-order low-pass filter according to the conventional example.

Characteristics of the first-order pass filter according to the first embodiment will be described while compared with characteristics of the first-order pass filters according to the conventional examples shown in FIG. 13 and FIG. 14. In the following, the currents IO flowing through the capacitors 17 and 107 in a short-circuited state are compared with each other on an assumption that n=4 for the conventional circuit of FIG. 13 and n=3 for the conventional circuit of FIG. 14. In this case, the capacitance C of the capacitors 17 and 107 and the cut-off frequency fc are the same, and the current I which determines the cut-off frequency fc is varied depending on the circuit.

Figure 3:
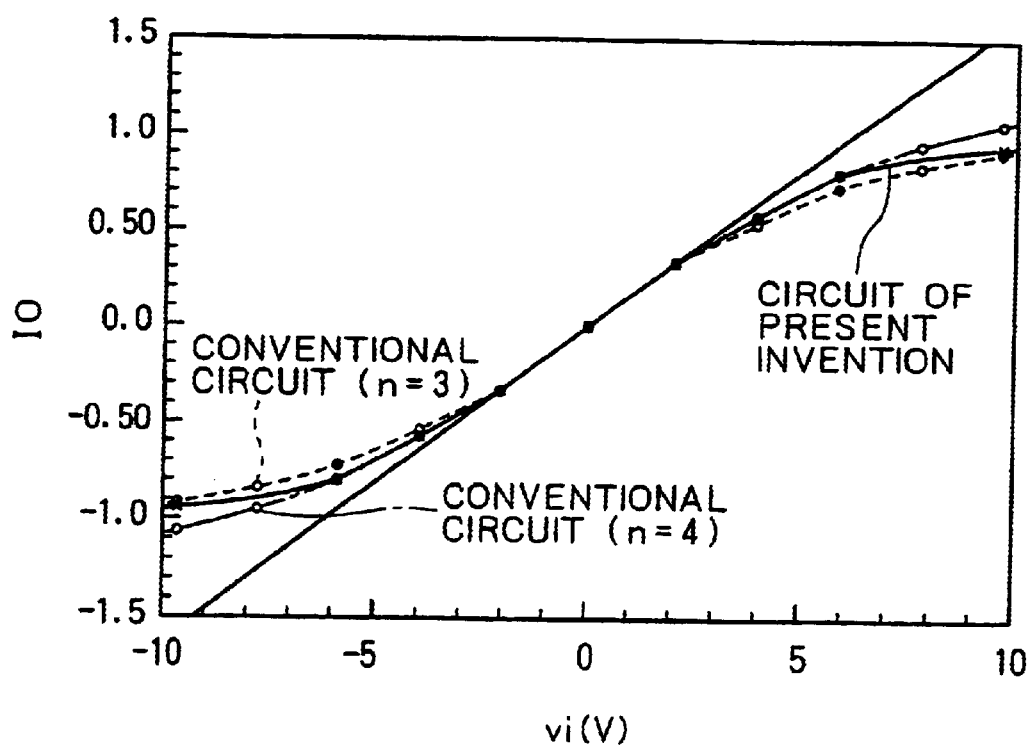
FIG. 3 is a characteristic diagram showing characteristics of current IO of the filter circuit according to the first embodiment with respect to input vi.

FIG. 3 shows characteristics of the current IO with respect to the input vi. In the characteristic diagram of FIG. 3, a curve indicated by alternate long and short dashed lines plotted by a mark of ○ represents a characteristic of the conventional circuit of FIG. 13 when n=4; a curve indicated by a broken line plotted by a mark of ○ represents a characteristic of the conventional circuit of FIG. 14 when n=3; and a curve indicated by a solid line plotted by a mark of x represents a characteristic of the circuit according to the first embodiment. As is clear from the characteristic diagram, linearity of the current IO of the circuit according to the first embodiment is better than that of the circuits according to the conventional examples.

Figure 4:
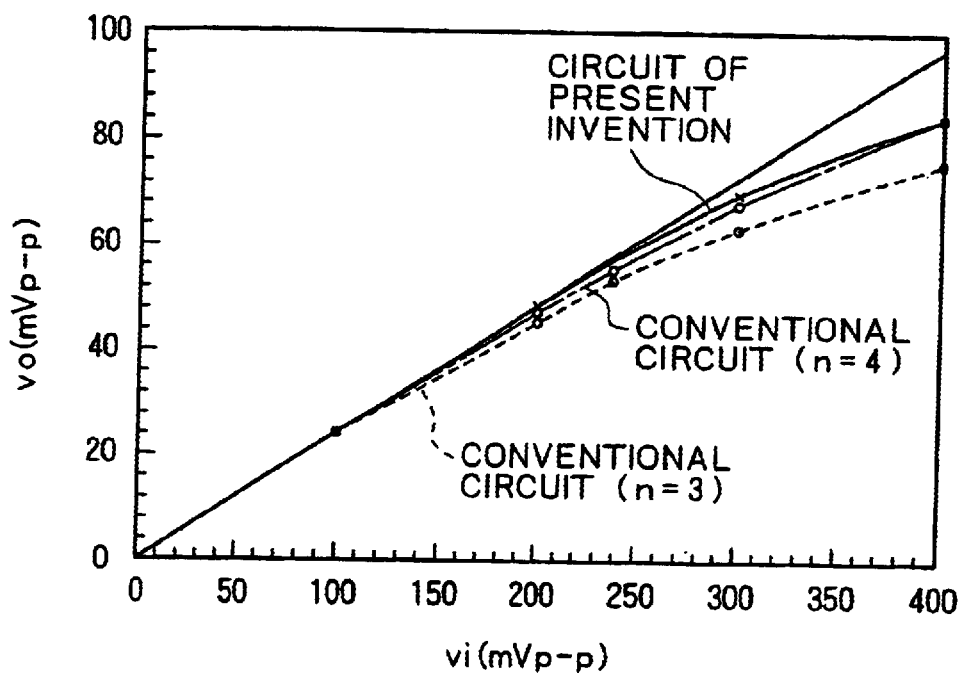
FIG. 4 is a diagram showing input-output characteristics of the filter circuit according to the first embodiment when f=fc.
Figure 5:
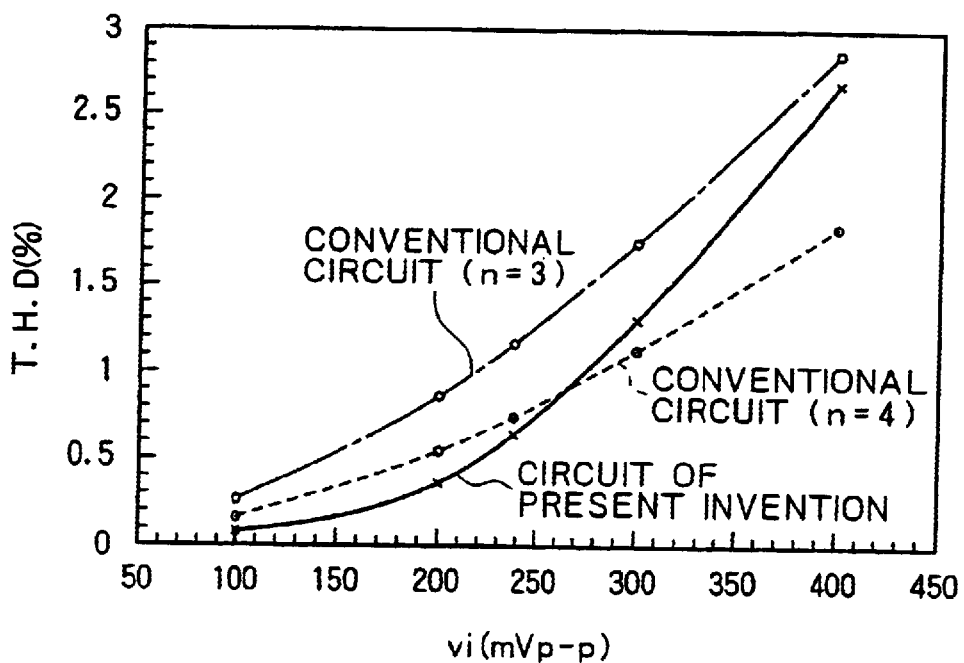
FIG. 5 is a diagram showing distortion factor characteristics of the filter circuit according to the first embodiment when f=fc.

FIG. 4 shows input-output characteristics when an input frequency f is f=fc. FIG. 5 shows distortion factor (T. H. D.) characteristics when f=fc. Also in these characteristic diagrams, a curve indicated by alternate long and short dashed lines plotted by a mark of ○ represents a characteristic of the conventional circuit of FIG. 13 when n=4; a curve indicated by a broken line plotted by a mark of ○ represents a characteristic of the conventional circuit of FIG. 14 when n=3; and a curve indicated by a solid line plotted by a mark of x represents a characteristic of the circuit according to the first embodiment. As is clear from the characteristic diagram of FIG. 4, linearity of the input-output characteristic of the circuit according to the first embodiment is better than that of the circuits according to the conventional examples. As is clear from the characteristic diagram of FIG. 5, the circuit according to the first embodiment has a distortion factor better than those of the circuits according to the conventional examples within a range of 0.9% or less.

A comparison of current consumption between the circuit according to the first embodiment and the circuits according to the conventional examples indicates that when the cut-off frequency fc is the same, as described above, a total current flowing through the filter circuit according to the first embodiment is 0.69 times that of the circuit according to the conventional example with n=3, and 0.39 times that of the circuit according to the conventional example with n=4. Thus, the circuit according to the first embodiment can greatly reduce current consumption as compared with the conventional circuits.

As is clear from the above description, by providing the first differential circuits 15A and 15B in which a ratio of the number of transistors to that of diodes is 1:4 and the second differential circuits 16A and 16B in which the ratio of the number of transistors to that of diodes is 4:1, and by connecting the current sources 23A and 23B to the connection nodes A and B of the diodes, the differential circuits have two operating points. By adding together the first differential circuits 15A and 15B and the second differential circuits 16A and 16B having two operating points, it is possible to reduce current consumption and also extend the input dynamic range. In addition, the cut-off frequency fc is made variable by changing the current I of the current sources 23A and 23B.

Figure 6:
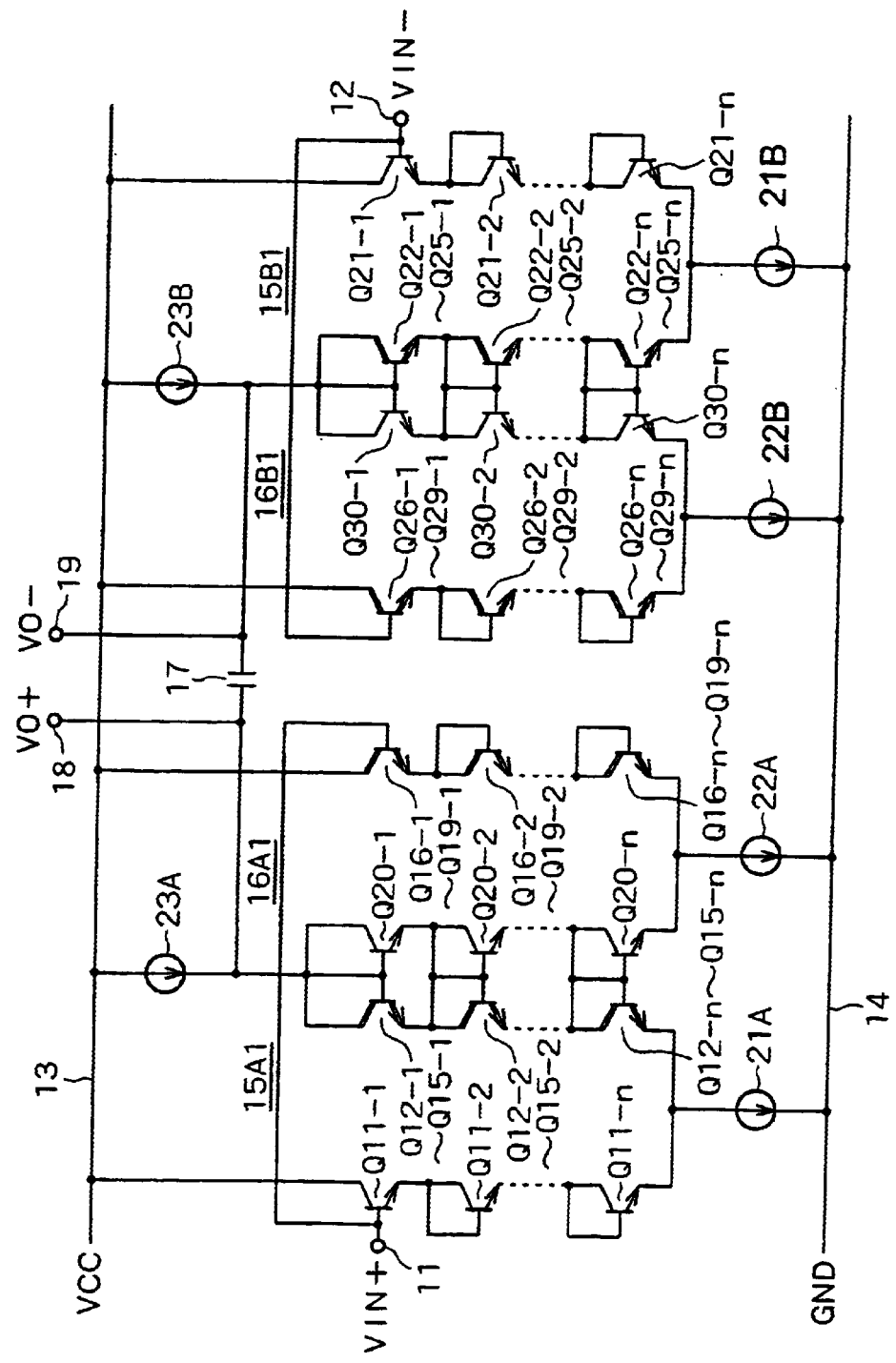
FIG. 6 is a circuit diagram showing a filter circuit according to a first modification of the first embodiment.

Various modifications of the first-order low-pass filter according to the first embodiment will next be described. FIG. 6 is a circuit diagram showing a first modification of the first-order low-pass filter according to the first embodiment.

The first-order low-pass filter according to the first modification is formed by using the first differential circuits 15A and 15B and the second differential circuits 16A and 16B of the first-order low-pass filter according to the first embodiment as fundamental circuits, and piling the fundamental circuits in n vertical stages, that is, connecting the fundamental circuits serially between a power supply line 13 and a GND line 14. A specific circuit configuration of the first-order low-pass filter will be described in the following. In the figure, the same parts as in FIG. 1 are identified by the same reference numerals.

A transistor Q11-1 in a first stage in a first differential circuit 15A1 is connected in series with diode-connected transistors Q11-2 in a second stage to Q11-n in an nth stage. Further, diode-connected transistors Q12-1 to Q15-1 connected in parallel with each other in the first stage are connected in series with diode-connected transistors Q12-2 to Q15-2 similarly connected in parallel with each other in the second stage to Q12-n to Q15-n connected in parallel with each other in the nth stage. An emitter electrode of the transistor Q11-n in the nth stage and each of emitter electrodes of the transistors Q12-n to Q15-n in the nth stage are connected to a common point, and thereby connected to the GND line 14 via a current source 21A.

In a second differential circuit 16A1, diode-connected transistors Q16-1 to Q19-1 connected in parallel with each other in the first stage are connected in series with diode-connected transistors Q16-2 to Q19-2 similarly connected in parallel with each other in the second stage to Q16-n to Q19-n connected in parallel with each other in the nth stage. A transistor Q20-1 in the first stage is connected in series with diode-connected transistors Q20-2 in the second stage to Q20-n in the nth stage. Each of emitter electrodes of the transistors Q16-n to Q19-n in the nth stage and an emitter electrode of the transistor Q20-n in the nth stage are connected to a common point, and thereby connected to the GND line 14 via a current source 22A.

Common connection points of bases and collectors of the transistors Q12-1 to Q15-1 in the first stage to Q12-n to Q15-n in the nth stage in the first differential circuit 15A1 are connected to common connection points of bases and collectors of the transistors Q20-1 in the first stage to Q20-n in the nth stage in the second differential circuit 16A1 in their respective stages. The common connection point of the bases and collectors in the first stage is connected to the power supply line 13 via a current source 23A, and also connected to one terminal of a capacitor 17 and one circuit output terminal 18.

A first differential circuit 15B1 and a second differential circuit 16B1 have exactly the same connecting relation as the first differential circuit 15A1 and the second differential circuit 16A1.

Thus, since the first-order low-pass filter according to the first modification is formed by piling each of the first differential circuits 15A and 15B and the second differential circuits 16A and 16B of the first-order low-pass filter according to the first embodiment in each of the n vertical stages, the first-order low-pass filter according to the first modification can extend the input dynamic range to n times that of the first-order low-pass filter according to the first embodiment. However, since the first modification employs a circuit configuration formed by connecting transistor circuits in n stages in series with each other between the power supply line 13 and the GND line 14, the first modification requires a correspondingly high supply voltage for circuit operation.

Figure 7:
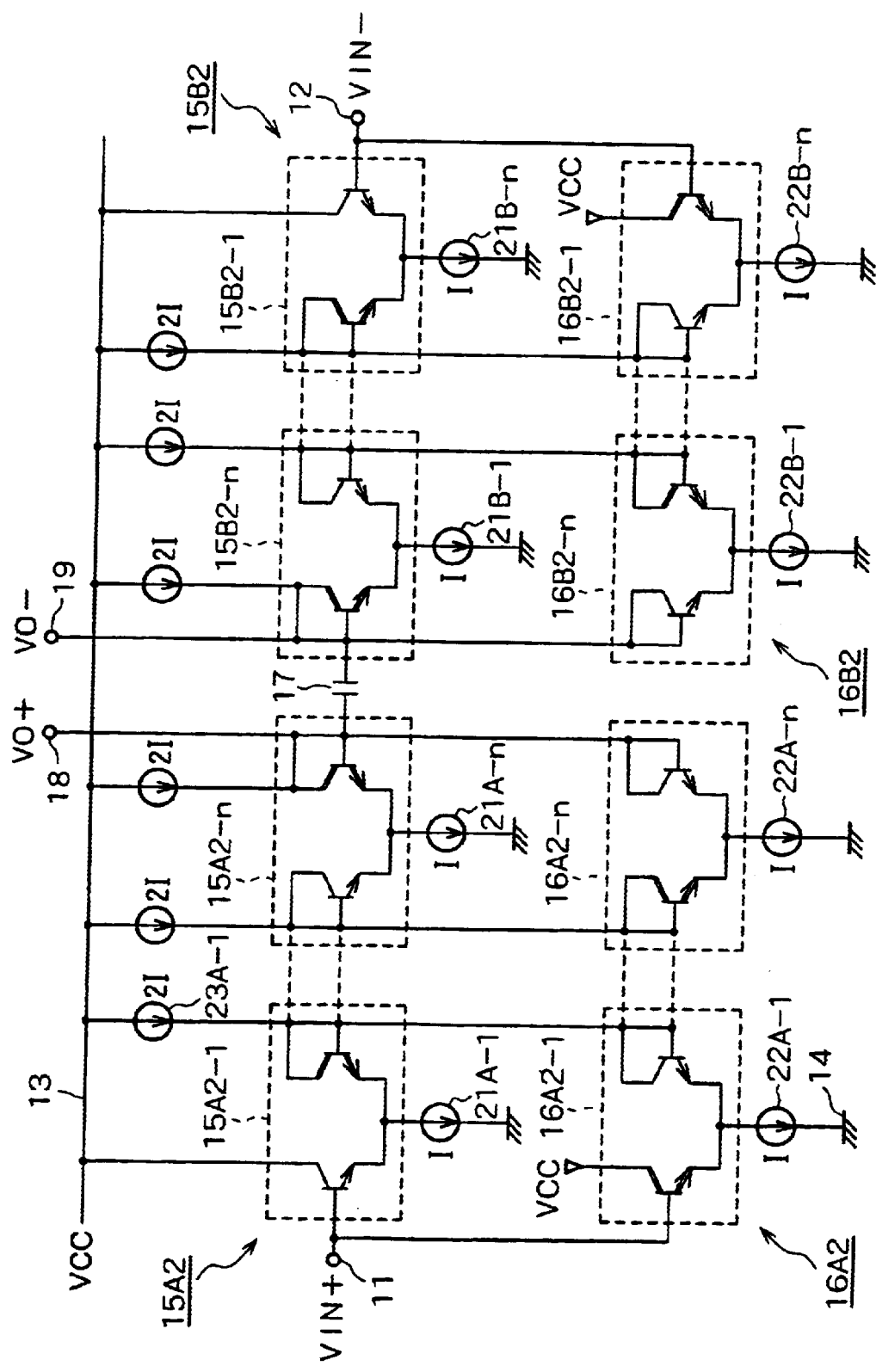
FIG. 7 is a circuit diagram showing a filter circuit according to a second modification of the first embodiment.

FIG. 7 is a circuit diagram showing a second modification of the first-order low-pass filter according to the first embodiment.

The first-order low-pass filter according to the second modification uses the first differential circuits 15A and 15B and the second differential circuits 16A and 16B of the first-order low-pass filter according to the first embodiment as fundamental circuits. As to the first differential circuit 15A, n fundamental circuits 15A2-1 to 15A2-n are arranged horizontally, that is, connected in series with each other between a circuit input terminal 11, a circuit output terminal 18, and one terminal of a capacitor 17.

N fundamental circuits 16A2-1 to 16A2-n as the second differential circuit 16A are connected in parallel with the n fundamental circuits 15A2-1 to 15A2-n, respectively. In this case, current sources 23A-1, . . . for supplying a current 2I twice that of current sources 21A-1 to 21A-n and 22A-1 to 22A-n are connected between a power supply line 13 and connection points of the n fundamental circuits 15A2-1 to 15A2-n connected in series with each other, respectively.

First differential circuits 15B2 and second differential circuits 16B2 have exactly the same connecting relation as the first differential circuits 15A2 and the second differential circuits 16A2.

Thus, since the first-order low-pass filter according to the second modification is formed by arranging each of the first differential circuits 15A and 15B of the first-order low-pass filter according to the first embodiment in each of the n horizontal stages, and by connecting the first differential circuits 15A and 15B in parallel with the second differential circuits 16A and 16B, respectively, the first-order low-pass filter according to the second modification can extend the input dynamic range, as in the case of the first-order low-pass filter according to the first modification. The first-order low-pass filter according to the second modification has another advantage of being capable of circuit operation at a low supply voltage because only two current sources and one transistor circuit are connected between the power supply line 13 and a GND line 14.

Figure 8:
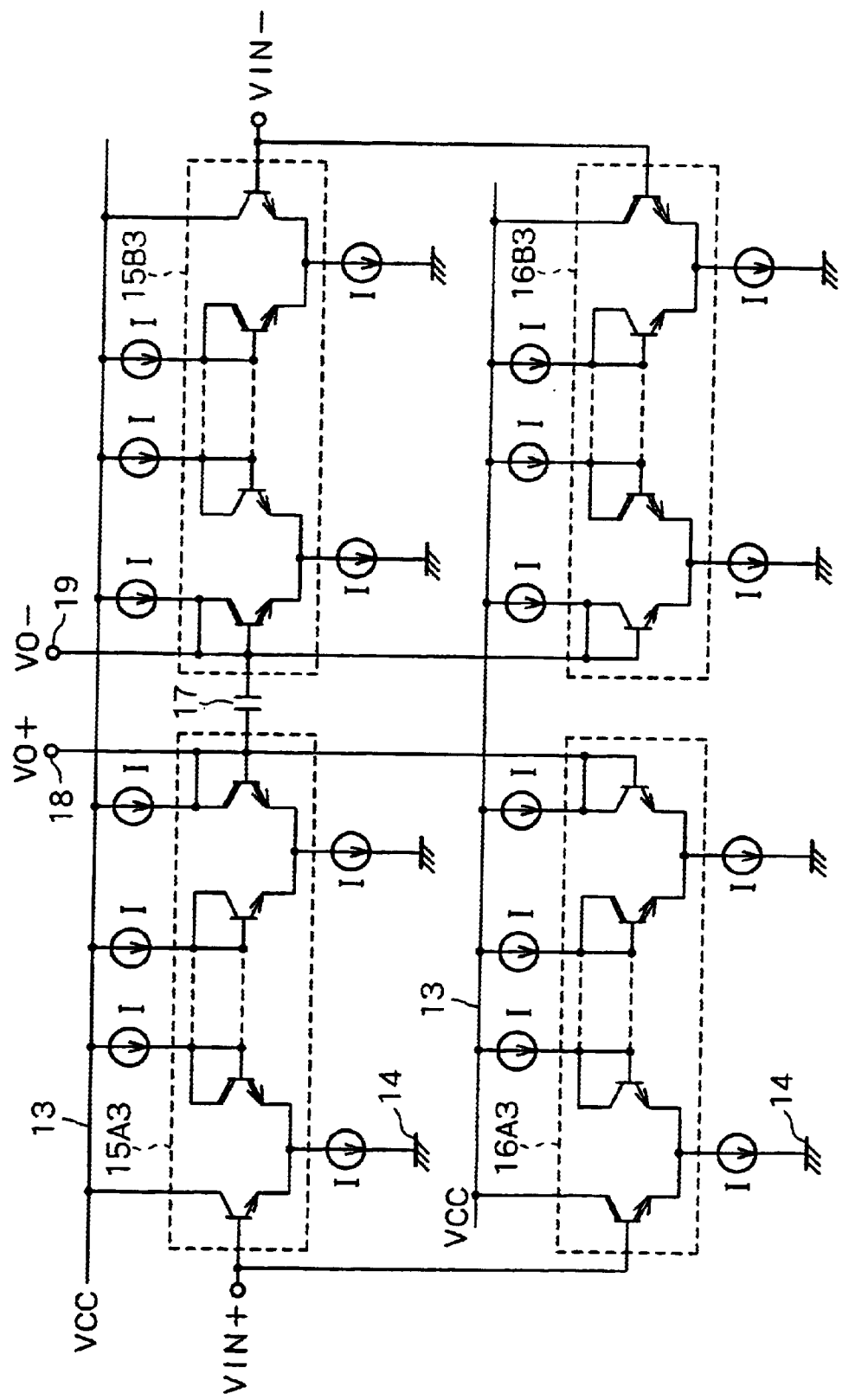
FIG. 8 is a circuit diagram showing a filter circuit according to a third modification of the first embodiment.

FIG. 8 is a circuit diagram showing a third modification of the first-order low-pass filter according to the first embodiment.

As in the case of the first-order low-pass filter according to the second modification, the first-order low-pass filter according to the third modification uses the first differential circuits 15A and 15B and the second differential circuits 16A and 16B of the first-order low-pass filter according to the first embodiment as fundamental circuits, and is formed by arranging the fundamental circuits in each of n horizontal stages.

The first-order low-pass filter according to the third modification is different from the first-order low-pass filter according to the second modification in that the first-order low-pass filter according to the second modification is formed by connecting the fundamental circuits 16A2-1 to 16A2-n as the second differential circuit 16A in parallel with the fundamental circuits 15A2-1 to 15A2-n as the first differential circuit 15A, respectively, whereas the first-order low-pass filter according to the third modification is formed by connecting second series connection circuits 16A3 and 16B3, which are formed by connecting n fundamental circuits as the second differential circuit 16A in series with each other, in parallel with first series connection circuits 15A3 and 15B3, respectively, formed by connecting n fundamental circuits as the first differential circuit 15A in series with each other.

As in the case of the first-order low-pass filter according to the second modification, the first-order low-pass filter according to the third modification can extend the input dynamic range, and also perform circuit operation at a low supply voltage.

Each of the above modifications has been described by taking as a specific example a case where the first differential circuits 15A and 15B in which the ratio of the number of transistors to that of diodes is 1:4 and the second differential circuits 16A and 16B in which the ratio of the number of transistors to that of diodes is 4:1 are used as fundamental circuits, and the fundamental circuits are combined with one another. However, it is also possible to combine differential circuits in which the ratio of the number of transistors to that of diodes is 1:4 m (m is an integer of 2 or more) and differential circuits in which the ratio of the number of transistors to that of diodes is 4 m:1, as opposed to the above fundamental circuits. This combination can further improve linearity of the characteristic of the current IO with respect to the input vi.

[Second Embodiment]

Figure 9:
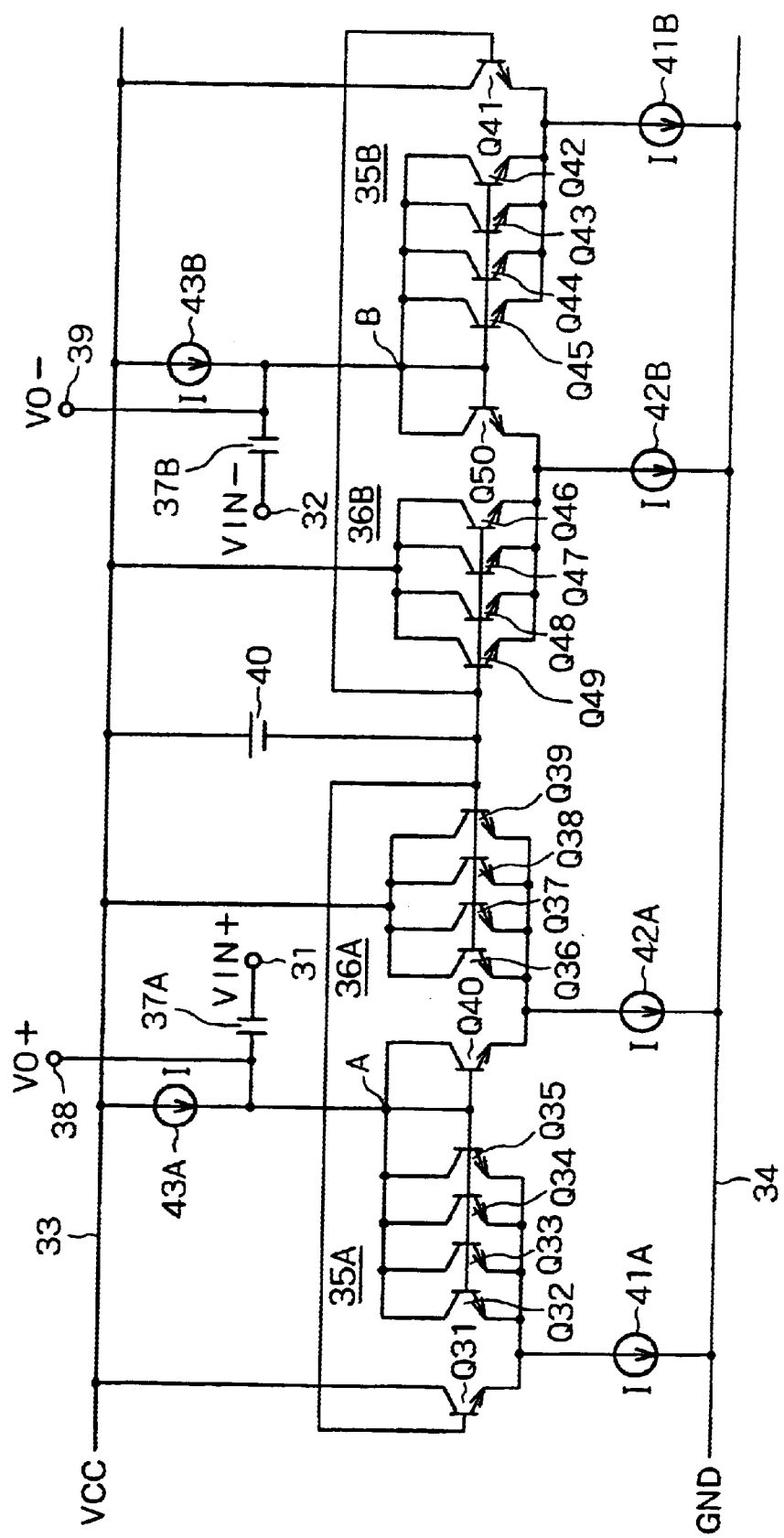
FIG. 9 is a circuit diagram of a configuration of a filter circuit according to a second embodiment of the present invention, showing a case in which the present invention is applied to a first-order high-pass filter.

FIG. 9 is a circuit diagram showing a configuration of a filter circuit according to a second embodiment of the present invention. FIG. 9 shows a case in which the present invention is applied to a first-order high-pass filter. Description in the following will be made by taking as an example a case where NPN-type bipolar transistors are used as transistors forming the circuit.

In FIG. 9, a first differential circuit 35A is formed by a transistor Q31 having a collector electrode connected to a power supply line 33 and four diode-connected transistors Q32 to Q35 connected in parallel with each other and each having an emitter electrode connected to an emitter electrode of the transistor Q31. A current source 41A is connected between a common emitter connection point of the transistors Q31 to Q35 and a GND line 34.

On the other hand, a second differential circuit 36A is formed by four transistors Q36 to Q39 connected in parallel with each other and a diode-connected transistor Q40 having an emitter electrode connected to each of emitter electrodes of the transistors Q36 to Q39. A current source 42A is connected between a common emitter connection point of the transistors Q36 to Q40 and the GND line 34.

A common connection point of bases and collectors of the transistors Q32 to Q35 in the first differential circuit 35A is connected to a common connection point of a base and a collector of the transistor Q40 in the second differential circuit 36A. A current source 43A is connected between the connection node A and the power supply line 33. Also, the connection node A is connected to one terminal of a capacitor 37A, and connected to a circuit output terminal 38. The other terminal of the capacitor 37A is connected to a circuit input terminal 31.

A base electrode of the transistor Q31 in the first differential circuit 35A and base electrodes of the transistors Q36 to Q39 in the second differential circuit 36A are connected to a negative-side electrode of a direct-current power supply 40. A positive-side electrode of the direct-current power supply 40 is connected to the power supply line 33.

A first and a second differential circuit 35B and 36B having exactly the same configuration as the thus formed first and second differential circuits 35A and 36A are provided between the negative-side electrode of the direct-current power supply 40 and a circuit output terminal 39. A current source 41B is connected between a common emitter connection point of transistors Q41 to Q45 in the first differential circuit 35B and the GND line 34. A current source 42B is connected between a common emitter connection point of transistors Q46 to Q50 in the second differential circuit 36B and the GND line 34.

A common connection point of bases and collectors of the transistors Q42 to Q45 in the first differential circuit 35B is connected to a common connection point of a base and a collector of the transistor Q50 in the second differential circuit 36B. A current source 43B is connected between the connection node B and the power supply line 33.

The connection node B is connected to one terminal of a capacitor 37B, and connected to the circuit output terminal 39. The other terminal of the capacitor 37B is connected to a circuit input terminal 32. A base electrode of the transistor Q41 in the first differential circuit 35B and base electrodes of the transistors Q46 to Q49 in the second differential circuit 36B are connected to the negative-side electrode of the direct-current power supply 40.

Figure 10:
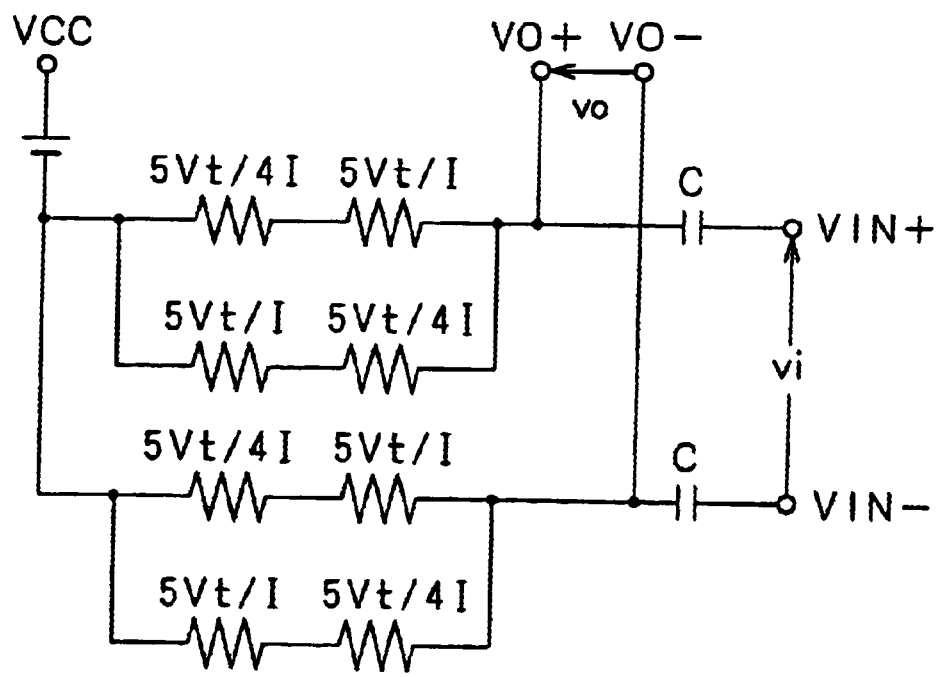
FIG. 10 is a diagram of a circuit equivalent to the filter circuit according to the second embodiment.

As is clear from the above description, the first differential circuits 35A and 35B and the second differential circuits 36A and 36B have exactly the same circuit configuration as the first differential circuits 15A and 15B and the second differential circuits 16A and 16B, respectively, in the filter circuit according to the first embodiment. Hence, a circuit equivalent to the filter circuit of FIG. 9 is as shown in FIG. 10. Thus, letting C be capacitance of each of the capacitors 37A and 37B, the filter circuit according to the second embodiment serves as a first-order high-pass filter having a transfer function H (=vo/vi):

[Equation 6]

$$H = \frac{s}{s + \frac{4I}{25V_t \cdot C}} \quad (11)$$

Cut-off frequency fc of the filter is:

$fc = 2I/25 \pi \cdot V_t \cdot C$

Since the first differential circuits 35A and 35B and the second differential circuits 36A and 36B have the same circuit configuration as the first differential circuits 15A and 15B and the second differential circuits 16A and 16B, respectively, in the filter circuit according to the first embodiment, the first-order high-pass filter according to the second embodiment can extend the input dynamic range while reducing current consumption, and perform circuit operation at a low supply voltage, as in the case of the first-order low-pass filter according to the first embodiment.

In addition, the first-order high-pass filter according to the second embodiment is susceptible of the same modifications as those of the first-order low-pass filter according to the first embodiment.

[Third Embodiment]

Figure 11:
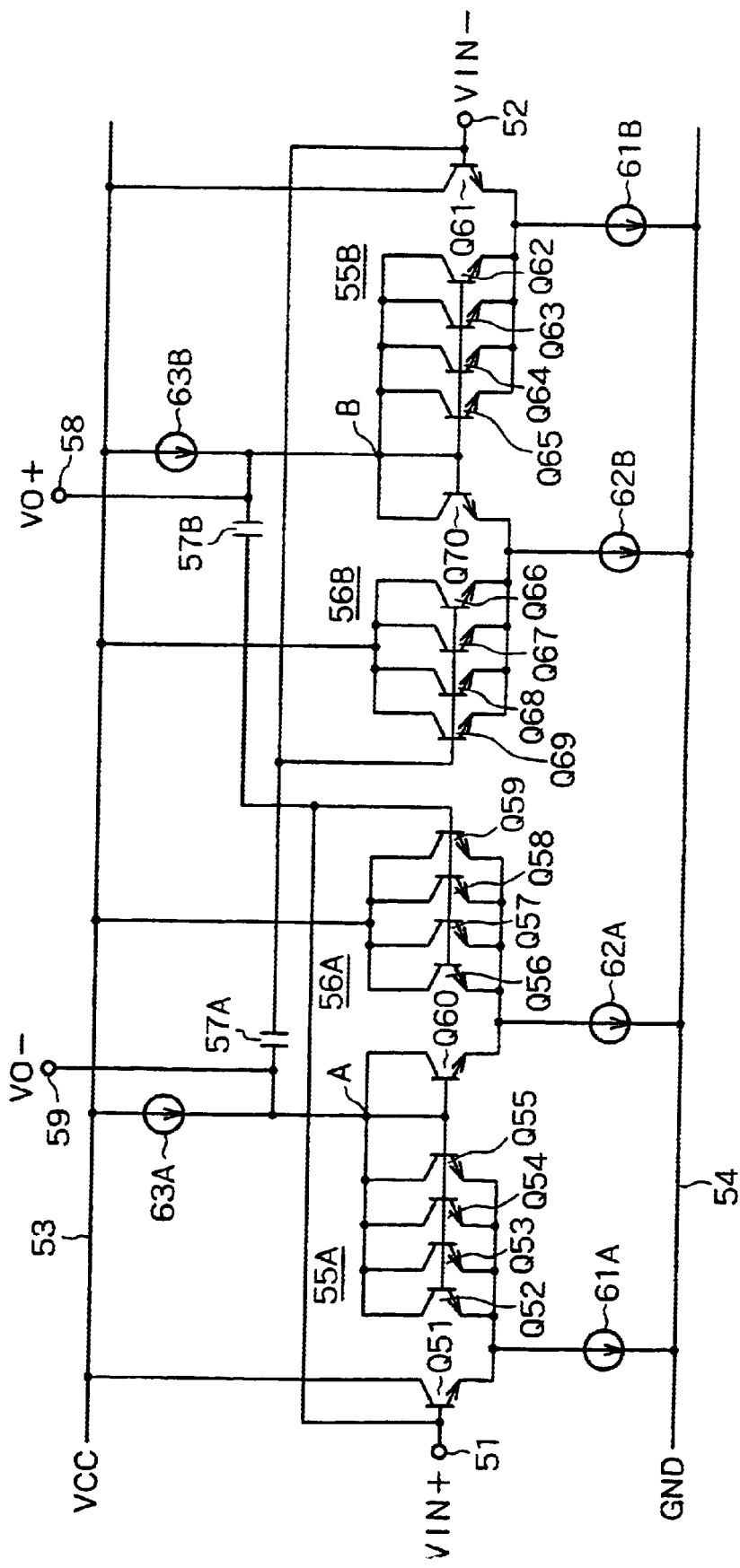
FIG. 11 is a circuit diagram of a configuration of a filter circuit according to a third embodiment of the present invention, showing a case in which the present invention is applied to a first-order all-pass filter.

FIG. 11 is a circuit diagram showing a configuration of a filter circuit according to a third embodiment of the present invention. FIG. 11 shows a case in which the present invention is applied to a first-order all-pass filter. Description in the following will be made by taking as an example a case where NPN-type bipolar transistors are used as transistors forming the circuit.

In FIG. 11, a first differential circuit 55A is formed by a transistor Q51 having a base electrode connected to a positive-side circuit input terminal 51 and a collector electrode connected to a power supply line 53 and four diode-connected transistors Q52 to Q55 connected in parallel with each other and each having an emitter electrode connected to an emitter electrode of the transistor Q51. A current source 61A is connected between a common emitter connection point of the transistors Q51 to Q55 and a GND line 54.

On the other hand, a second differential circuit 56A is formed by four transistors Q56 to Q59 connected in parallel with each other and each having a base electrode connected to the circuit input terminal 51 and a diode-connected transistor Q60 having an emitter electrode connected to each of emitter electrodes of the transistors Q56 to Q59. A current source 62A is connected between a common emitter connection point of the transistors Q56 to Q60 and the GND line 54.

A common connection point of bases and collectors of the transistors Q52 to Q55 in the first differential circuit 55A is connected to a common connection point of a base and a collector of the transistor Q60 in the second differential circuit 56A. A current source 63A is connected between the connection node A and the power supply line 53. Also, the connection node A is connected to one terminal of a capacitor 57A, and connected to a negative-side circuit output terminal 59. The other terminal of the capacitor 57A is connected to a negative-side circuit input terminal 52.

A first and a second differential circuit 55B and 56B having exactly the same configuration as the thus formed first and second differential circuits 55A and 56A are connected between the negative-side circuit input terminal 52 and a positive-side circuit output terminal 58. A current source 61B is connected between a common emitter connection point of transistors Q61 to Q65 in the first differential circuit 55B and the GND line 54. A current source 62B is connected between a common emitter connection point of transistors Q66 to Q70 in the second differential circuit 56B and the GND line 54.

A common connection point of bases and collectors of the transistors Q62 to Q65 in the first differential circuit 55B is connected to a common connection point of a base and a collector of the transistor Q70 in the second differential circuit 56B. A current source 63B is connected between the connection node B and the power supply line 53. The connection node B is connected to one terminal of a capacitor 57B, and connected to the positive-side circuit output terminal 58. The other terminal of the capacitor 57B is connected to the positive-side circuit input terminal 51.

Figure 12:
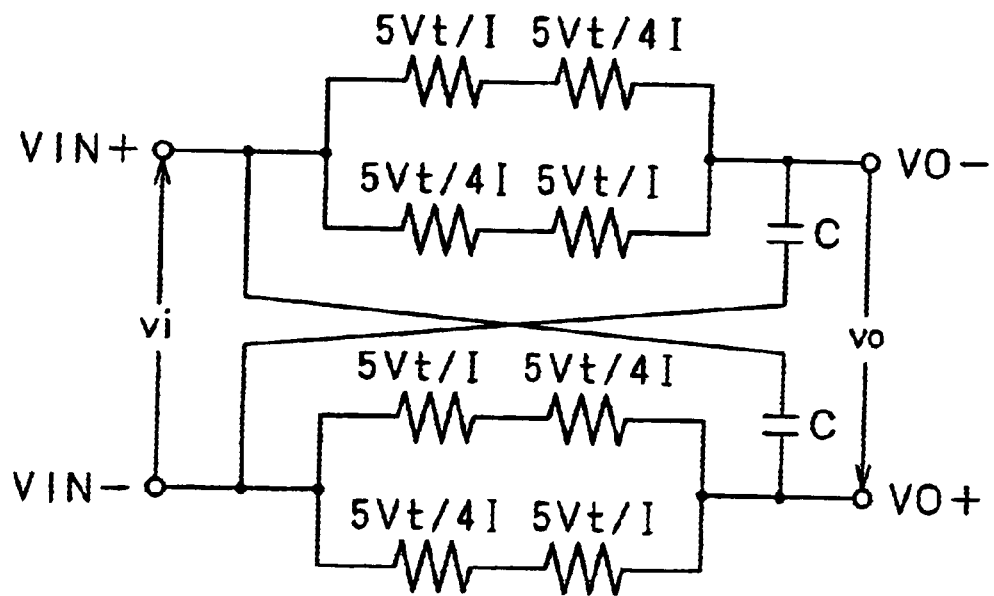
FIG. 12 is a diagram of a circuit equivalent to the filter circuit according to the third embodiment.

As is clear from the above description, the first differential circuits 55A and 55B and the second differential circuits 56A and 56B have exactly the same circuit configuration as the first differential circuits 15A and 15B and the second differential circuits 16A and 16B, respectively, in the filter circuit according to the first embodiment. Hence, a circuit equivalent to the filter circuit of FIG. 11 is as shown in FIG. 12. Thus, letting C be capacitance of each of the capacitors 57A and 57B, the filter circuit according to the third embodiment serves as a first-order all-pass filter having a transfer function H (=vo/vi):

[Equation 7]

$$H = \frac{s - \frac{4I}{25V_t \cdot C}}{s + \frac{4I}{25V_t \cdot C}} \quad (12)$$

Since the first differential circuits 55A and 55B and the second differential circuits 56A and 56B have the same circuit configuration as the first differential circuits 15A and 15B and the second differential circuits 16A and 16B, respectively, in the filter circuit according to the first embodiment, the first-order all-pass filter according to the third embodiment can extend the input dynamic range while reducing current consumption, and perform circuit operation at a low supply voltage, as in the case of the first-order low-pass filter according to the first embodiment.

In addition, the first-order all-pass filter according to the third embodiment is susceptible of the same modifications as those of the first-order low-pass filter according to the first embodiment.

It is to be noted that each of the foregoing embodiments has been described by taking as an example a filter circuit of differential operation in which an input signal vi is applied between the differential circuit input terminals, and an output signal vo is derived from the differential circuit output terminals; however, each of the foregoing embodiments may be a filter circuit of single operation, for example, in which the negative-side circuit input terminal and the negative-side circuit output terminal are grounded so that an input signal is applied between the positive-side circuit input terminal and the GND, and an output signal is derived from between the positive-side circuit output terminal and the GND.

In addition, in each of the foregoing embodiments, the NPN-type bipolar transistors are used as transistors forming the circuit; however, the circuit can be formed with PNP-type bipolar transistors by changing polarity of the power supply.

As described above, according to the present invention, by providing first differential circuits in which the ratio of the number of transistors to that of diodes is 1:4 and second differential circuits in which the ratio of the number of transistors to that of diodes is 4:1, and by connecting current sources to the diodes, it is possible to extend the input dynamic range while reducing current consumption. Furthermore, the cut-off frequency is made variable by changing the current of the current sources.

What is claimed is:

1. A filter circuit comprising:
   a first circuit, connected to a first terminal of a capacitor, comprising:
      a first differential circuit connected between a first circuit input terminal and a first circuit output terminal, said first differential circuit comprising a plurality of fundamental circuits connected in series between a first power supply and a second power supply to form n vertical stages, where n is an integer greater than 1, each vertical stage formed by a first transistor and four parallel diode-connected transistors, said first transistor of said first vertical stage connected in series with said first transistors of the $2^{nd}$ to n vertical stages, said four parallel diode-connected transistors of said first vertical stage connected in series with said diode-connected transistors of the $2^{nd}$ to n vertical stages, an emitter electrode of said first transistor in the nth vertical stage and each of said emitter electrodes of the four parallel diode-connected transistors in the nth vertical stage are connected to said second power supply by a first current source,
      a second differential circuit comprising a plurality of fundamental circuits connected in series between said first power supply and said second power supply to form n vertical stages, each vertical stage formed by a second transistor and four parallel transistors, said second transistor of said first vertical stage connected in series with said second transistors of the $2^{nd}$ to n vertical stages, said four parallel transistors of said first vertical stage connected in series with said parallel transistors of the $2^{nd}$ to n vertical stages, an emitter electrode of said second transistor in the nth vertical stage and each of said emitter electrodes of the four parallel transistors in the nth vertical stage connected to said second power supply by a second current source,
      a first connection node connecting base electrodes and collector electrodes of said four parallel diode-connected transistors of said first vertical stage in said first differential circuit to said base electrode and said collector electrode of said second transistor of said first vertical stage in said second differential circuit, the first connection node connected to said first circuit output terminal and to said first power supply by a third current source, and
   a second circuit having a symmetrically identical configuration as said first circuit with respect to a second terminal of said capacitor and including a second circuit output terminal, and a second circuit input terminal, said second circuit connected to said second terminal of said capacitor, said second circuit connected to a second terminal of said capacitor between said second circuit input terminal and said second circuit output terminal,
   wherein said filter circuit serves as a first-order low-pass filter.

2. A filter circuit comprising:
   a first circuit, connected to a first terminal of a capacitor, comprising:
      a first differential circuit comprising a plurality of fundamental circuits connected in series between a first circuit input terminal and a circuit output terminal, each fundamental circuit formed by a first transistor and four parallel diode-connected transistors, and
      a second differential circuit comprising a plurality of fundamental circuits connected in parallel with said plurality of fundamental circuits of said first differential circuit and between said first circuit input terminal, said circuit output terminal, and said first terminal of said capacitor, each fundamental circuit formed by a second transistor and four parallel transistors; and
   a second circuit having a symmetrically identical configuration as said first circuit with respect to a second terminal of said capacitor and including a second circuit output terminal, and a second circuit input terminal,
   wherein said filter circuit serves as a first-order low-pass filter.

3. A filter circuit comprising:
   a first circuit, connected to a first terminal of a capacitor, comprising:
      a first differential circuit comprising a plurality of fundamental circuits connected in series between a first circuit input terminal and a first circuit output terminal, each fundamental circuit formed by a first transistor and four parallel diode-connected transistors, and
      a second differential circuit comprising a plurality of fundamental circuits connected in parallel with said plurality of fundamental circuits of said first differential circuit and between said first circuit input terminal, said first circuit output terminal, and said first terminal of said capacitor, each fundamental circuit formed by a second transistor and four parallel transistors; and
   a second circuit having a symmetrically identical configuration as said first circuit with respect to a second terminal of said capacitor and including a second circuit output terminal, and a second circuit input terminal,
   wherein said filter circuit serves as a first-order low-pass filter.

4. A filter circuit comprising:
a first circuit comprising:
- a first differential circuit formed by a first transistor having a collector electrode connected to a first power supply, and four parallel diode-connected transistors and each having an emitter electrode connected to an emitter electrode of said first transistor, said emitter electrode of said first transistor and each of said emitter electrodes of the four parallel diode-connected transistors connected to a second power supply by a first current source, and
- a second differential circuit formed by a second transistor having a collector electrode connected to said first power supply, and four parallel transistors and each having an emitter electrode connected to an emitter electrode of said second transistor, said emitter electrode of said second transistor and each of said emitter electrodes of the four parallel transistors connected to said second power supply by a second current source,
- a base electrode of said first transistor in said first differential circuit and base electrodes of said four parallel transistors in said second differential circuit connected to a direct-current power supply, and
- a first connection node connecting base electrodes and collector electrodes of said four parallel diode-connected transistors of said first differential circuit to said base electrode and said collector electrode of said second transistor in said second differential circuit, the first connection node connected to a first circuit output terminal and to a first terminal of a first capacitor, a second terminal of said first capacitor connected to a first circuit input terminal; and a second circuit having a symmetrically identical configuration as said first circuit with respect to a second terminal of a second capacitor and including a second connection node connected to a second circuit output terminal and to a first terminal of said second capacitor, said second terminal of said second capacitor connected to a second circuit input terminal, said second circuit connected to said direct-current power supply, wherein said filter circuit serves as a first-order high-pass filter.

5. A filter circuit comprising:
a first circuit comprising:
- a first differential circuit formed by a first transistor having a collector electrode connected to a first power supply, and four parallel diode-connected transistors and each having an emitter electrode connected to an emitter electrode of said first transistor, an emitter electrode of said first transistor and each of said emitter electrodes of the four parallel diode-connected transistors connected to a second power supply by a first current source, and
- a second differential circuit comprising a second transistor having a collector electrode connected to said first power supply, and four parallel transistors and each having an emitter electrode connected to an emitter electrode of said second transistor, said emitter electrode of said second transistor and each of said emitter electrodes of the four parallel transistors connected to said second power supply by a second current source, a base electrode of said first transistor in said first differential circuit and base electrodes of said four parallel transistors in said second differential circuit connected to a first circuit input terminal, and
- a first connection node connecting base electrodes and collector electrodes of said four parallel diode-connected transistors of said first differential circuit to said base electrode and said collector electrode of said second transistor in said second differential circuit, the first connection node connected to a second circuit output terminal and to a first terminal of a first capacitor, a second terminal of said first capacitor connected to a second circuit input terminal; and a second circuit having a symmetrically identical configuration as said first circuit with respect to a first terminal of a second capacitor and including a second connection node connected to a first circuit output terminal and to said first terminal of said second capacitor, a second terminal of said second capacitor connected to said first circuit input terminal, wherein said filter circuit serves as a first-order all-pass filter.

* * * * *